United States Patent [19]

Schanen et al.

[11] Patent Number: 5,177,697
[45] Date of Patent: Jan. 5, 1993

[54] AUTOZEROING APPARATUS AND METHOD FOR A COMPUTERIZED TOMOGRAPHY DATA ACQUISITION SYSTEM

[75] Inventors: Paul C. Schanen, Waukesha, Wis.; Robert H. Pedersen, Woodinville, Wash.; Kishore C. Acharya, Brookfield, Wis.

[73] Assignee: General Electric Company, Milwaukee, Wis.

[21] Appl. No.: 576,340

[22] Filed: Aug. 31, 1990

[51] Int. Cl.$^5$ .................. H03M 1/06; H03M 1/10
[52] U.S. Cl. .................. 364/571.04; 341/120
[58] Field of Search ........... 364/571.04, 571.01, 364/571.05, 571.06; 341/118, 120, 75, 155, 165; 378/4, 19

[56] References Cited

U.S. PATENT DOCUMENTS

| 4,070,707 | 1/1978 | Barber | 364/414 |
| 4,097,860 | 6/1978 | Araseki et al. | 364/571.05 X |
| 4,163,947 | 8/1979 | Weedon | 328/128 |
| 4,679,162 | 7/1987 | Ferber et al. | 364/571 |
| 4,725,950 | 2/1988 | Woods | 364/571.06 X |
| 4,815,118 | 3/1989 | Acharya et al. | 378/4 X |
| 4,903,023 | 2/1990 | Evans et al. | 341/155 X |
| 5,047,772 | 9/1991 | Ribner | 341/118 X |
| 5,053,770 | 10/1991 | Mayer et al. | 341/118 |

FOREIGN PATENT DOCUMENTS 0201415 11/1986 European Pat. Off. .
2008350 5/1979 United Kingdom .

Primary Examiner—Parshotam S. Lall
Assistant Examiner—E. J. Pipala
Attorney, Agent, or Firm—Quarles & Brady

[57] ABSTRACT

An autozeroing apparatus is disclosed for correcting the offset error in a computerized axial tomography (CAT) scanner data acquisition subsystem (DAS). The DAS includes a floating point amplifier for applying discrete amplification factors, or gain range segments, to an analog input before conversion to digital in an A/D converter. A digital autozero circuit is connected to the output of the A/D converter and adds a digital offset value to each A/D converter sample during data acquisition to correct for the net offset errors throughout the DAS. Separate storage latches are included for storing offset values corresponding to each gain range segment, and the offset value used for each sample correction corresponds to the gain range segment used for that sample. During an autozero reference interval, a reference voltage is applied to the DAS and the offset values are updated so as to force the corrected A/D converter output to agree with the reference voltage.

6 Claims, 7 Drawing Sheets

AUTOZEROING APPARATUS AND METHOD FOR A COMPUTERIZED TOMOGRAPHY DATA ACQUISITION SYSTEM

BACKGROUND OF THE INVENTION

The field of the invention is automatic offset compensating (i.e. auto-zeroing) circuits for high speed amplifiers and, more particularly, auto-zeroing circuits for computerized tomography (CT) data acquisition systems.

In a CT scanner, a large number of X-ray sensors are exposed to an X-ray source, each sensor producing a separate analog signal. Each of the sensor analog signals is then converted to a digital value at a high rate of speed to allow a rapid rate of successive X-ray exposures, or views. The conversion rate required can be quite high, usually less than 2.5 microseconds per conversion. This high speed signal processing requires that the amplifiers used in processing the analog signals prior to conversion to digital must have a wide frequency bandwidth. One of the trade-offs or negative aspects associated with the use of such high speed amplifiers is a loss or degradation of the D.C. or low frequency characteristics. One of the primary elements of this D.C. degradation is the tendency of the offset voltage error for the high speed amplifiers to drift with time and/or temperature.

One prior approach that has been used to improve the offset error performance of an individual high speed amplifier 10 is shown in FIG. 1. In this configuration, a second low speed amplifier 11 serves as an analog integrator. The input 12 of integrating amplifier 11 is connected through an analog switch 13 to the output 14 of the high speed amplifier 10. The output 15 of integrating amplifier 11 is connected to one input of a summing junction 16 feeding the input 17 of the high speed amplifier 10. Another input on summing junction 16 is selectably connected either through a second analog switch 20 to an analog input signal 22 to be amplified, or through a third analog switch 23 to a reference potential, e.g. ground 24.

During normal signal processing, switch 20 is closed and switches 13 and 23 are open. In that condition, the analog input signal 22 is summed with an offset correction value, i.e. the output 15 of offset integrating amplifier 11, before being amplified and appearing as the output signal 14. The "offset correction" signal 15 is adjusted periodically according to a predetermined duty cycle by activating an "ADJUST ANALOG OFFSET" signal on line 25. During the autozero interval, switch 20 is open and switches 13 and 24 are closed. In that case, ground potential is applied to one input of the summing junction 16, while the low speed integrator forces the output 14 of high speed amplifier 10 to the reference potential, i.e. zero, by the nature of the closed loop integration function. When the ADJUST ANALOG OFFSET signal 25 is deactivated, switches 13 and 24 are again opened. The integrating amplifier 11 then has zero input, and holds the output 15 at the last set offset correction value.

Several negative characteristics are associated with this approach. First, if the initial offset of the low speed integrator 11 is not zero, it must be adjusted or "tweaked" at manufacture. Second, if the offset of the low speed integrator 11 drifts with time, it must be re-adjusted. Third, because the autozero switches 13, 20 and 23 and their associated control line 25 are digital in nature, they may contribute excess noise, or electromagnetic interference into the normal signal. Fourth, because the switch 13 has charge injection associated with it, and the low speed integrator 11 has some finite leakage with time, the duty cycle for repeating "autozero mode" calibration is fairly high.

A final drawback to the prior autozero loop of FIG. 1 relates to its use in a data acquisition system for a CT scanner. In that application, several stages of preamplification are applied to the input signal in a switch selected manner in order to implement a "floating point" type preamplification. Preamplification is applied in discrete "gain ranges" to bring the input signal up to an optimum level for conversion to a digital value by an analog to digital (A/D) converter. The gain range selected serves as an "exponent" part of a digital floating point output, while the A/D output provides a fractional part. Each preamplification stage comprises one high speed amplifier 10, each of which introduces a separate offset error to be corrected. One autozero loop of the prior type needs to be dedicated to each preamplifier stage, or alternatively to each unique series of preamplifier stages, in order to offset correct all possible gain ranges. In addition, the A/D converter following the preamplification stages also introduces an offset and must be corrected as well.

SUMMARY OF THE INVENTION

A digital autozeroing apparatus according to the invention corrects for the offset error in a data acquisition system of the type including an analog input and an analog to digital (A/D) converter for producing a digital output corresponding to the analog input. The digital autozeroing apparatus comprises a digital storage device, a digital adder, and a control circuit. The digital storage device stores an offset value. The digital adder has a first input connected to receive the offset value from the digital storage device and a second input connected to receive the digital output of the A/D converter. The digital adder produces a corrected digital output value by adding the offset value to the A/D converter digital output. The control circuit updates the offset value in the digital storage device by (a) applying a predetermined reference voltage to the input of the data acquisition system, (b) comparing the corrected digital output value of the digital adder with a predetermined reference value, and (c) if the corrected digital output value of the digital adder is different than the predetermined reference value, then changing the offset value in the digital storage device so as to reduce the difference between the corrected digital output value of the digital adder and the predetermined reference value.

The data acquisition system may include a floating point amplifier connected between the analog input and the A/D converter, the floating point amplifier providing amplification of the analog input in one active gain range segment out of a plurality of available discrete gain range segments. In that case, the digital autozeroing apparatus may include a separate digital storage device for each available discrete gain range segment of the floating point amplifier, with each digital storage device storing an offset value corresponding to one of the available discrete gain range segments. The first input of the digital adder may then be selectably connected to receive the offset value corresponding to the active gain range segment, and the control circuit may update the offset value corresponding to the active gain range segment.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 2:
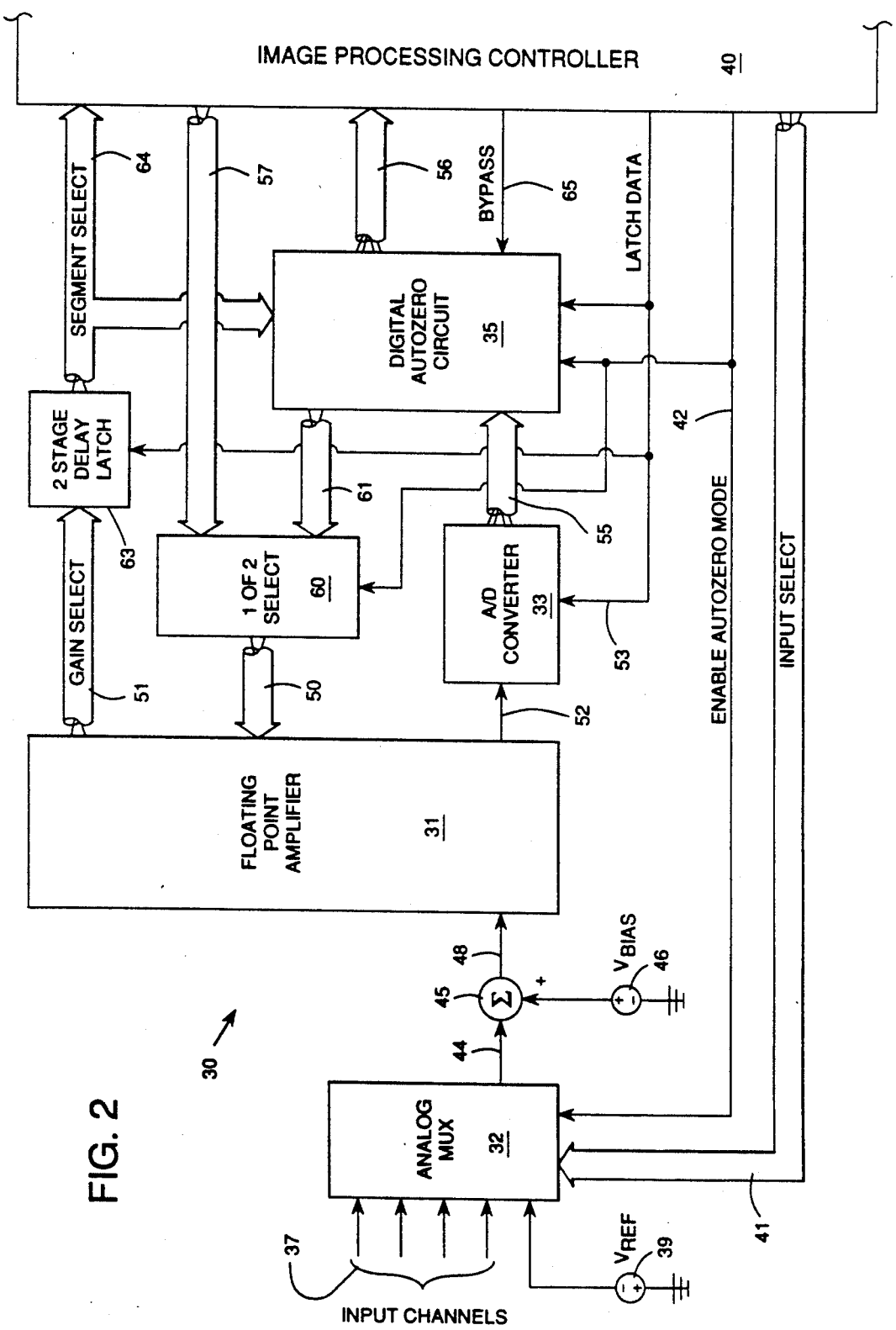
FIG. 2 is a block diagram which includes a digital autozeroing apparatus according to the invention.

Referring to FIG. 2, a data acquisition system, or DAS 30 for a computerized tomography (CT) scanner (not shown) includes a floating point amplifier 31, analog multiplexer 32, analog to digital (A/D) converter 33 and a digital autozero circuit 35 according to the present invention. Although the autozero circuit 35 is usable with prior floating point amplifiers, the floating point amplifier 31 preferred in this embodiment is a novel high speed type, described in a copending application filed on the same date as this application and entitled HIGH PRECISION COMPOSITE AMPLIFIER WITH IMPROVED HIGH SPEED RESPONSE, the contents of which are herein incorporated by reference.

The analog multiplexer 32 receives a plurality of input channels 37, each of which is itself a time multiplexed combination of the outputs from multiple X-Ray detectors. An additional input 38 on the analog multiplexer 32 is connected a stable reference voltage source 39. For reasons to be described later, the reference voltage 39 is preferably chosen to be a small negative voltage, although a simple ground, or zero signal connection may alternately be used. An image processing controller 40 generates a multi-bit digital INPUT SELECT signal 41 to indicate which of the connected input channels 37 the analog multiplexer 32 is to select. The image processing controller 40 also provides an ENABLE AUTOZERO MODE signal 42, one connection of which is made to the analog multiplexer 32. When activated, the ENABLE AUTOZERO MODE signal 42 instructs the analog multiplexer 32 to override selection of the input channels 37, and instead select the reference voltage 39. The reference voltage 39 is then used to calibrate, or autozero, the DAS 30 in a manner to be described in detail below.

The signal selected by the analog multiplexer 32, either one of the input channels 37 or the reference voltage 39 as commanded by the image processing controller 40, is connected through the analog multiplexer 32 to output line 44. The output 44 is connected as one input to a summer 45, with the other input being provided by a bias voltage source, $V_{BIAS}$ 46. Because the A/D converter 33 used in this embodiment is a unipolar type, its input voltage must be positive to avoid an under-range condition The bias voltage $V_{BIAS}$ 46 is added to the output 44 of the analog multiplexer 32 to ensure that noise that may be present on low level signals does not cause such an under-range condition. The bias thus added to all signals is then later compensated for in the image processing controller 40. The magnitude of the negative reference voltage 39 is arranged to be less than the magnitude of the positive bias voltage $V_{BIAS}$ 46, so that their sum is still positive.

An output 48 from summer 45 is connected as an analog input to floating point amplifier 31. As described above in the background of the invention, the floating point amplifier 31 applies discrete amplification factors to the input 48 in order to bring it into an optimum range for input into A/D converter 33. In this embodiment, the floating point amplifier 31 is capable of applying three amplification factors, or "gain ranges" of 1, 8 and 64. Each "gain range" is referred to as a "segment", and the segments are numbered I-III, corresponding to the gain ranges of 1, 8 and 64, respectively. A multi-bit digital input 50 into the floating point amplifier 31 is used to indicate which gain range is to be used. The input 50 is encoded to either command one specific gain range to be used, or to allow the floating point amplifier to operate in an "automatic" mode in which the gain range is automatically selected by the floating point amplifier 31 based on the value of the input signal 48. The gain range being used at any moment, either by command or automatic selection, is output on a GAIN SELECT line 51.

The amplified analog output from floating point amplifier 31 is applied via line 52 to an analog input of A/D converter 33 for conversion to a digital value. The A/D converter is a high speed, sample and hold type. Conversions are performed repetitively in a pipeline fashion at a rate of approximately 2.33 microseconds ($\mu$S) per conversion. A LATCH DATA signal 53 generated by the image processing controller 40 is connected to the A/D converter 33, and serves as a clock to synchronize the start of each new conversion cycle and to indicate the availability of digital output data from the previous conversion on an output bus 55.

Still referring to FIG. 2, the digital autozero circuit according to the present invention can now be described. Up to this point, the analog circuits 31 and 32 and the A/D converter 33 have provided no offset correction. The prior analog circuits used for offset compensation have been eliminated, thereby greatly simplifying those circuits. As a result, the output 55 of A/D converter 33 may contain substantial amounts of offset, which are corrected by the digital autozero circuit 35. In general, the digital autozero circuit 35 operates by measuring the total system offset during periodic autozero reference intervals. Adjustment of the offset values is accomplished during an autozero interval, when the normal data acquisition cycle described above is periodically and momentarily suspended. The image processing controller 40 determines when the autozero reference intervals are to be performed, and activates the ENABLE AUTOZERO MODE signal 42 for the duration of each such autozero reference interval. The autozero reference interval is performed periodically by activating the ENABLE AUTOZERO MODE signal 42, thereby temporarily suspending the normal data acquisitions. When the ENABLE AUTOZERO MODE signal 42 is active, normal data acquisitions are temporarily suspended, and the reference voltage 39 is selected by the analog multiplexer 32 in that condition, the output 55 of A/D converter 33 should present a digital value exactly corresponding to the known reference voltage 39. The digital autozero circuit 35 then reads the A/D output 55, and any deviation from the expected reading represents the net offsets introduced by the circuits 31-33.

The digital value read during the autozero reference interval is therefore a measure of the accumulated offsets in the entire preceding analog processing. An additive inverse, e.g. two's complement, for the the measured digital offset value is then computed and stored according to a method described in detail below. When the autozero reference interval ends and normal data acquisition resumes, the stored inverse value of the measured offset is algebraically added to each A/D output sample, thereby correcting the net offset error in one operation. The corrected digital value for each A/D sample is transmitted to the image processing controller 40 over bus 56.

The process of measuring a digital offset, and computing and storing the inverse thereof, is repeated for each gain range of the floating point amplifier 31, since each gain range may exhibit a different offset. A GAIN COMMAND signal 57 is output by the image processing controller 40 to set the gain range for the floating point amplifier 31 during normal data acquisitions. A "1 of 2" digital multiplexer 60 is used to connect the gain range select input 50 of the floating point amplifier 31 to either the GAIN COMMAND signal 57 or a GAIN OVERRIDE signal 61 from the digital autozero circuit 35. The ENABLE AUTOZERO MODE signal 42 is connected as the select input to multiplexer 60, such that the GAIN COMMAND signal 57 is selected during normal data acquisitions and the GAIN OVERRIDE signal 61 is selected during autozero reference intervals. By way of the GAIN OVERRIDE signal 61, the digital autozero circuit 35 is able to cycle the floating point amplifier 31 through its different gain ranges when an autozero reference interval is active to thereby measure separate offsets for each of the different gain ranges.

When normal data acquisitions resume, the GAIN COMMAND signal 57 is restored to control of the gain range select input 50 of the floating point amplifier 31. The GAIN COMMAND signal 57 is usually in the "automatic" setting, allowing the floating point amplifier 31 to determine the gain range based on the input level. Specific gain range commands are typically used only for diagnostic purposes. At any rate, the currently active gain range as indicated on GAIN SELECT bus 51 is applied to a two stage delay latch 63 in order to parallel the pipeline delay of A/D converter and an additional latch, to be described later, internal to the digital autozero circuit 35. The delay latch 63 is clocked by the LATCH DATA signal 53. Each gain range of the floating point amplifier 31 is referred to in the art as a "segment", which represents an "exponent" part of the floating point output of amplifier 31. A SEGMENT SELECT output 64 of delay latch 63 therefore presents the segment, or "exponent" part of the floating point amplifier 31 output simultaneously with the corresponding "fractional" part, the latter fractional part having been delayed by the pipeline formed by the A/D converter 31 and the internal latch of the digital autozero circuit 35. The SEGMENT SELECT output 64 is connected to both the the image processing controller 40 and the digital autozero circuit 35. The digital autozero circuit 35 utilizes the SEGMENT SELECT output 64 to address the appropriate offset correction value previously stored, i.e. corresponding to the gain range indicated by the SEGMENT SELECT output 64. The image processing controller 40 then reads both the SEGMENT SELECT output 64 and the corrected fractional part on bus 56, thereby inputting a complete, offset corrected floating point digital value.

The LATCH DATA signal 53 is connected to the digital autozero circuit in order to synchronize its operation with that of the other system components. A BYPASS signal 65 is also provided by the image processing controller 40 and connected to the digital autozero circuit 35. When activated, the BYPASS signal commands the digital autozero circuit 35 to inhibit the application of the stored offset correction values, thereby delivering raw, uncorrected A/D data directly to bus 56. This latter feature is provided as a diagnostic tool, for example to determine that the uncorrected system offsets are within a predetermined tolerance.

Figure 3:
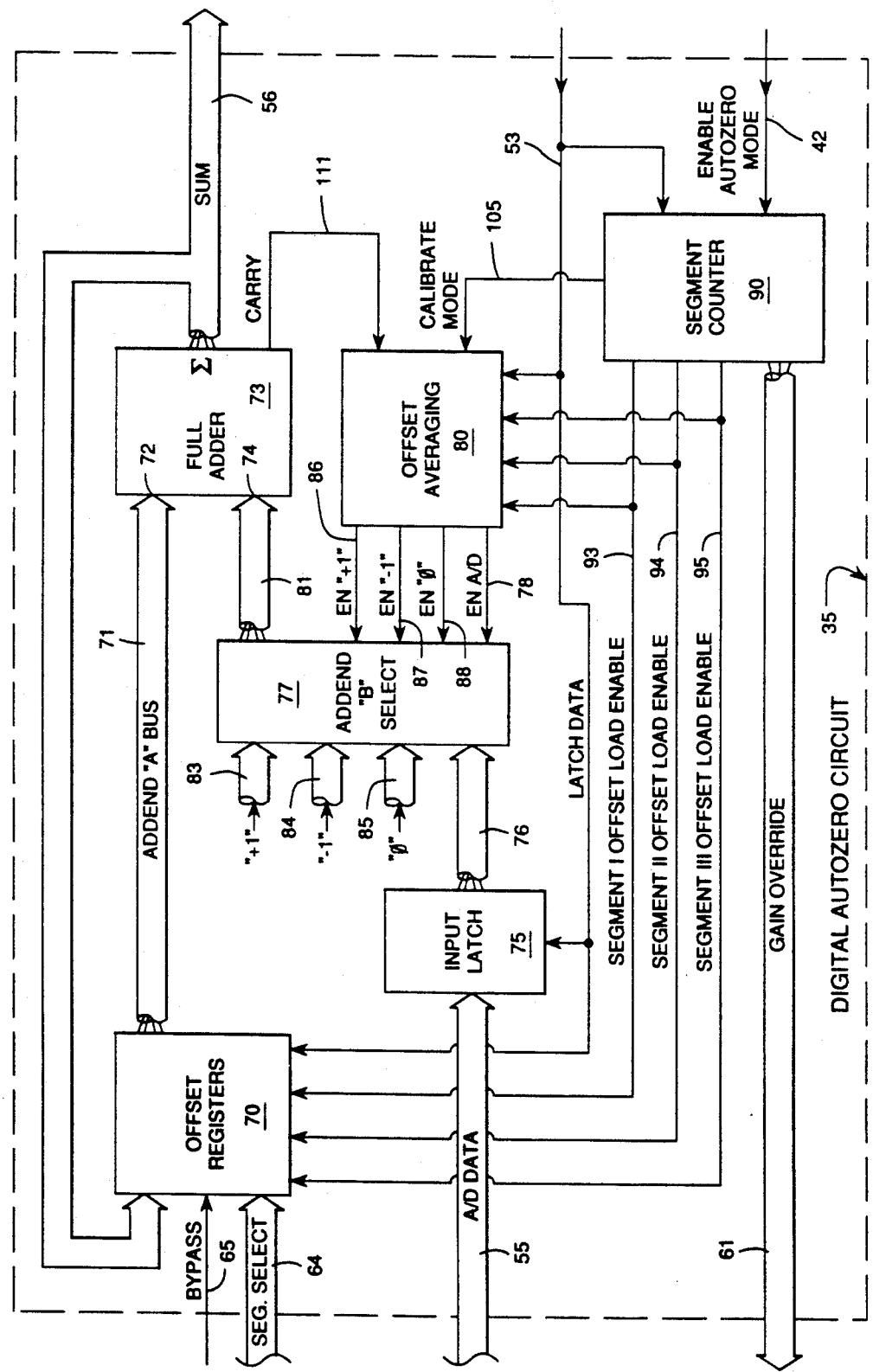
FIG. 3 is a block diagram of the digital autozeroing circuit which forms a part of the digital autozeroing apparatus of FIG. 1.

Referring to FIG. 3, the digital autozero circuit 35 includes a set of three separate offset storage registers, one for each segment of the floating point amplifier 31. The offset storage registers and their associated circuitry, to be described in detail later, are represented by "offset registers" block 70. Each one of the offset storage registers stores an individual offset value for one of the segments I-III of the floating point amplifier 31. The segment select bus 64 connects to the offset registers block 70 to select one of the offset storage registers for output onto an addend "A" bus 71. The addend "A" bus 71 in turn is connected to one input 72 of a parallel, binary full adder 73. During the normal, data acquisition operation of the digital autozero circuit 35, i.e. with ENABLE AUTOZERO MODE signal 42 false, the adder 73 obtains the raw, uncorrected fractional part of the floating point sample to be corrected on another input 74. The "sum" output of adder 73 on bus 56 in this mode therefore comprises the corrected fractional part of the floating point sample, i.e. raw A/D data plus the digitally stored offset correction value from the appropriate offset storage register, algebraically added together.

The data path for delivering the uncorrected A/D data on line 55 to the input 74 of adder 73 is as follows. The digital output data 55 from A/D converter 33 is clocked into an input latch 75 by the LATCH DATA signal 53. The output of input latch 75 is presented on bus 76 as one input to a multiplexer 77, labeled addend "B" select. An ENABLE A/D signal 78 is supplied to the addend "B" select multiplexer 77 by an offset averaging circuit 80. The exact function of the offset averaging circuit 80 is described later. However, as long as the ENABLE AUTOZERO MODE signal 42 is deactivated, i.e. false, the ENABLE A/D signal 78 remains active, and multiplexer 77 couples bus 76 through to input 74 of adder 73 via an output bus 81.

The addend B select multiplexer 77 also includes three other input busses 83-85 and corresponding enabling lines 86-88, respectively. The input busses 83-85 each connect to a different binary, two's complement, digital constant value, +1, −1 and 0 respectively. The enabling lines 86-88 are all under the control of the offset averaging circuit 80, and are used to select any one of the constant values on busses 83-85. These constants are used to adjust the offset values in the offset storage registers in a manner described in detail below.

Adjustment of the offset values is accomplished during the above described autozero reference interval, as signified by activation of the ENABLE AUTOZERO MODE signal 42. The ENABLE AUTOZERO MODE signal 42 is input to a segment counter circuit 90, which performs basic control over an autozeroing sequence performed during the autozero reference interval.

Figure 4:
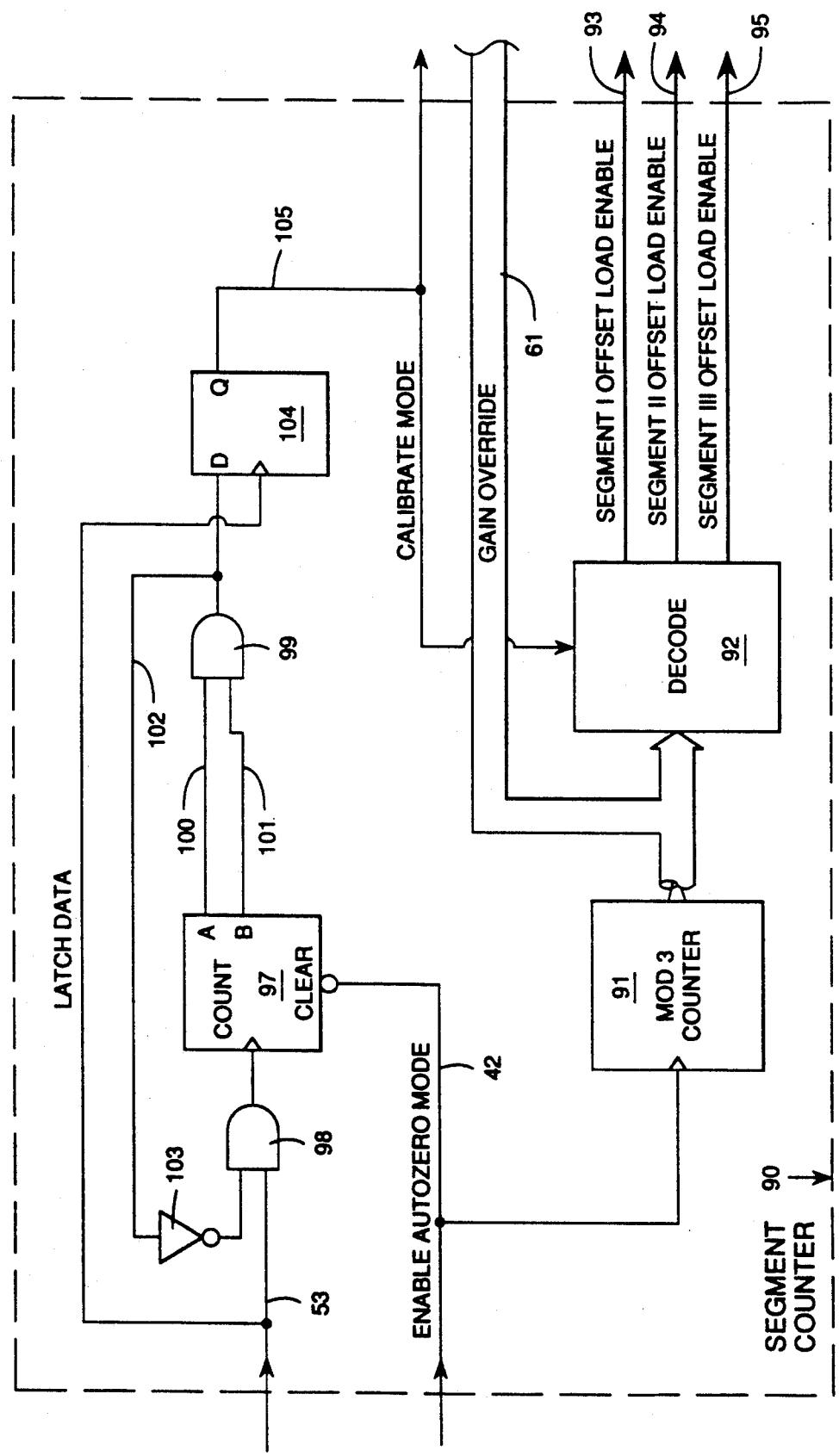
FIG. 4 is a block diagram of the segment counter circuit which forms a part of the digital autozeroing circuit of FIG. 3.

Referring to FIGS. 3 and 4, the segment counter 90 includes modulo 3 counter 91 which is clocked by the ENABLE AUTOZERO MODE signal 42. A two bit output containing the current count of modulo 3 counter 91 is connected as the GAIN OVERRIDE bus 61, to thereby select one of the three segments I-III for adjustment of the associated offset value during any one autozero reference interval. Since the ENABLE AUTOZERO MODE signal 42 is used to clock modulo 3 counter 91, the selected segment remains constant throughout each separate autozero reference interval. On subsequent autozero intervals, the ENABLE AUTOZERO MODE signal 42 clocks the modulo 3 counter 91 to select the next segment in the modulo 3 sequence. In that way, each of the segments I-III is selected in turn for offset value adjustment, i.e. on a round robin basis. The GAIN OVERRIDE bus 61 is also connected to a decode circuit 92 which decodes the GAIN OVERRIDE bus 61 to separate SEGMENT OFFSET LOAD ENABLE lines 93-95 corresponding to the separate segments I-III, respectively.

When the ENABLE AUTOZERO MODE signal 42 is first activated, the reference voltage 39 is selected as the input to the DAS 30. However, because of the pipeline formed by the A/D converter 33 and input latch 75, it takes three cycles of the LATCH DATA signal 53 for data corresponding to the reference voltage 39 to arrive at the output bus 76 of input latch 75. For that reason, correction of the offset values in the offset registers 70 is delayed for three cycles of the LATCH DATA signal 53 after the ENABLE AUTOZERO MODE signal 42 is activated, thereby purging the previous data in the A/D converter 33/input latch 75 pipeline. A counter 97 is used to generate the required delay. The ENABLE AUTOZERO MODE signal 42 is connected as the "clear" input to counter 97, holding the counter 97 reset (i.e. a count of "0") while the ENABLE AUTOZERO MODE signal 42 is not active. At the start of the autozero reference interval, the ENABLE AUTOZERO MODE signal 42 is activated and the counter 97 is enabled. LATCH DATA signal 53 is connected through AND gate 98 as a clock input to counter 97. Another AND gate 99 is connected to the two least significant output bits 100 and 101 of counter 97. Output 102 of AND gate 99 therefore becomes true when a count of three has been attained on counter 97. Output 102 of AND gate 99 is connected to another input of AND gate 98 through inverter 103, thereby inhibiting further counting by counter 97 once a count of three has been reached. Output 102 of AND gate 99 is also connected to a "D" input of delay type flip-flop 104. Flip-flop 104 is clocked by the LATCH DATA signal 53, and presents an output comprising a CALIBRATE MODE signal 105. When the counter 97 reaches a count of three, the CALIBRATE MODE signal 105 is activated, signifying that valid reference data is now available and adjustment of the offset registers can begin.

Referring again to FIG. 3, the operation of adjusting the offset values contained in the offset storage registers 70 is an important feature of this invention, which can now be described. In normal processing by the image processing controller 40, 14 bits of resolution are required for the fractional part 56 of the floating point number representing each sample. In order to insure that such 14 bit resolution is maintained, particularly across segment boundaries, the A/D converter 33 preferably converts to a resolution greater than 14 bits. In this particular embodiment, the A/D converter 33 preferred actually provides a 16 bit output. This additional resolution provides for better alignment of the data converter transfer function across segment, or gain range boundaries. However, as a consequence of the increased resolution of the A/D converter 33, the least significant bits are much more sensitive to electronic noise present on the input signal 52. In fact, the noise on the input 52 is typically many times greater than the least significant bit of the output 55 of A/D Converter 33. Therefore, any one sample may not be representative of the true offsets present in the system. For that reason, the offset correction provided by the invention is instead based on a statistical average over many samples, which is described in detail below. The averaging process mitigates to a large extent the noise present on the low order bits of A/D converter 33, resulting in highly precise offset correction values in the offset correction registers 70.

The basic approach for setting the offset registers 70 is to apply the reference voltage 39 through the floating point amplifier 31 to the input 52 of A/D converter 33, and adjust the offset registers 70 so that the sum 56 is zero when those offset values are added to the A/D output 55 representing reference voltage 39. However, because of high resolution used for the A/D converter 33 as described above, the offset value needed to zero the output of adder 73 for any one particular A/D sample would have noise, or "flutter" in the least significant bits. If the offset value to be used for data acquisition were to be chosen based on such a single sample, then the chosen sample may be in error by several counts, depending on the noise induced error when the sample was taken.

Figure 5:
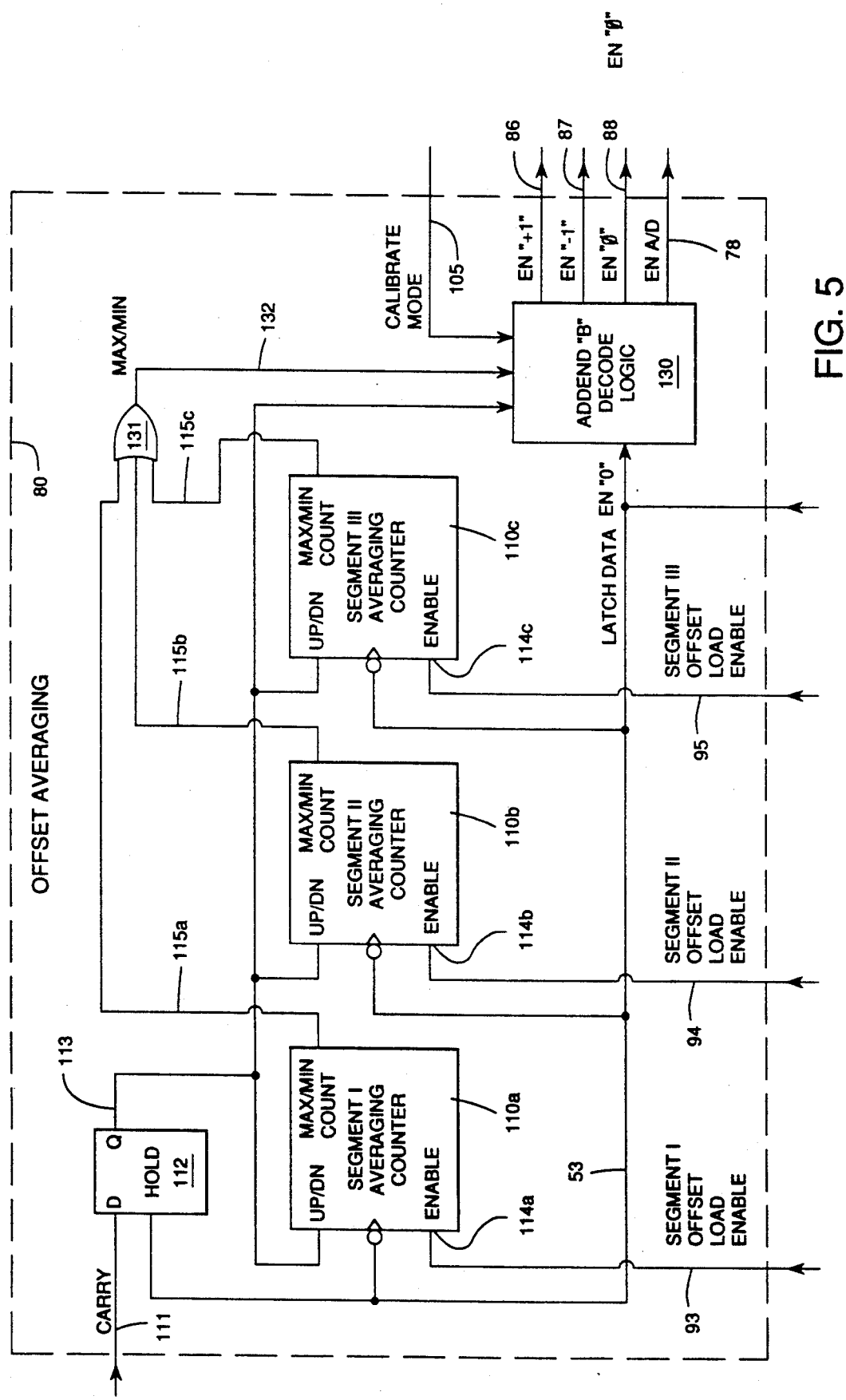
FIG. 5 is a block diagram of the offset averaging circuit which forms a part of the digital autozeroing circuit of FIG. 3.

Referring now to FIGS. 3 and 5, in order to provide a more accurate offset value, an offset averaging circuit 80 is used in the process of updating the offset registers 70. Separate averaging counters 110a-110c are provided for each segment I-III, respectively, as described in detail below. For each A/D sample taken during the autozero reference interval, a determination is made as to whether the output 56 of adder 73 is non-negative, i.e. positive or zero, as indicated by a CARRY output 111 of adder 73. It should be noted that the offset values in the offset storage registers 70 are always two's complement negative numbers, to offset the always positive output of A/D converter 33. If the CARRY signal 111 is "one", then the offset value applied for that sample was too high, i.e. not negative enough, and the individual averaging counter 110a-110c corresponding to the segment sampled is decremented. The case where the CARRY signal 111 is "one" also corresponds to a "zero" result from adder 73, i.e. the offset value is the exact two's complement of the current A/D sample. In that event, the offset value is similarly considered too high, i.e. not negative enough, for averaging purposes, and the corresponding individual averaging counter 110a-110c is decremented. If, on the other hand, the CARRY signal 111 is "zero", then the offset value applied for that sample was too low, i.e. too negative, and the individual offset averaging counter 110a-110c corresponding to the segment sampled is incremented. Therefore, on successive samplings for any one segment, the associated averaging counter 110a-110c is either incremented or decremented, depending on the offset value used being either too low or too high, respectively.

The exact operation of the averaging counters 110a-110c is as follows. The CARRY signal 111 is applied as a "D" input to a transparent latch 112. The LATCH DATA signal 53 is applied to a HOLD input of latch 112, whereby when the LATCH DATA signal 53 is high, the CARRY signal 111 propagates through to an output 113 of latch 112. The output 113 of latch 112 is connected as an UP/DOWN signal to each of the averaging counters 110a-110c. The LATCH DATA signal 53 is also connected as a clock input to each of the averaging counters 110-110c. Each averaging counter 110a-110c also includes an ENABLE input 114a-114c, connected to the corresponding OFFSET LOAD ENABLE signal 93-95, respectively. Therefore, only one of the averaging counters 110a-110c is enabled at any one time. The enabled averaging counter 110a-10c counts either up or down in response to the negative, or falling edge of the LATCH DATA signal 53, with the direction of the count being determined by the UP/DOWN signal 113. On the falling edge of the LATCH DATA signal 53, the transparent latch 112 holds the current "carry" output stable for the counting operation.

It is important to note that as the enabled averaging counter 110a-110c is being incremented and decremented, the associated offset value in the offset register 70 is not immediately changed. The averaging process continues until the enabled averaging counter 110a-110c either underflows or overflows, indicating that the associated offset value in the offset registers 70 needs to be either incremented or decremented, respectively. In that way, the averaging counters 110a-110c are in effect performing a statistical average of the offset value in the presence of noise. As long as there are approximately the same number of increments as decrements for the enabled averaging counter 110a-110c, the corresponding offset value is fairly well centered with respect to the noise. But if, on the average, there more increments than decrements, or vice versa, then the offset value is not perfectly centered with respect to the noise, and the associated offset value needs to be adjusted. Note that the greater the deviation of the offset value from the true offset needed, the greater will be the ratio of increments to decrements, or vice versa, and the faster will be the overflow or underflow of the appropriate averaging counter 110a-110c.

Figure 1:
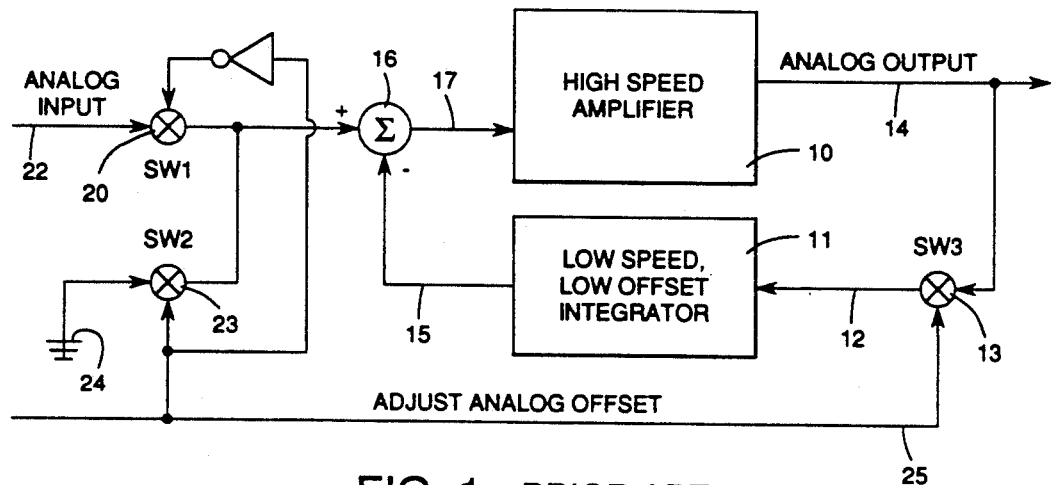
FIG. 1 is block diagram of a prior art analog autozeroing circuit.
Figure 6:
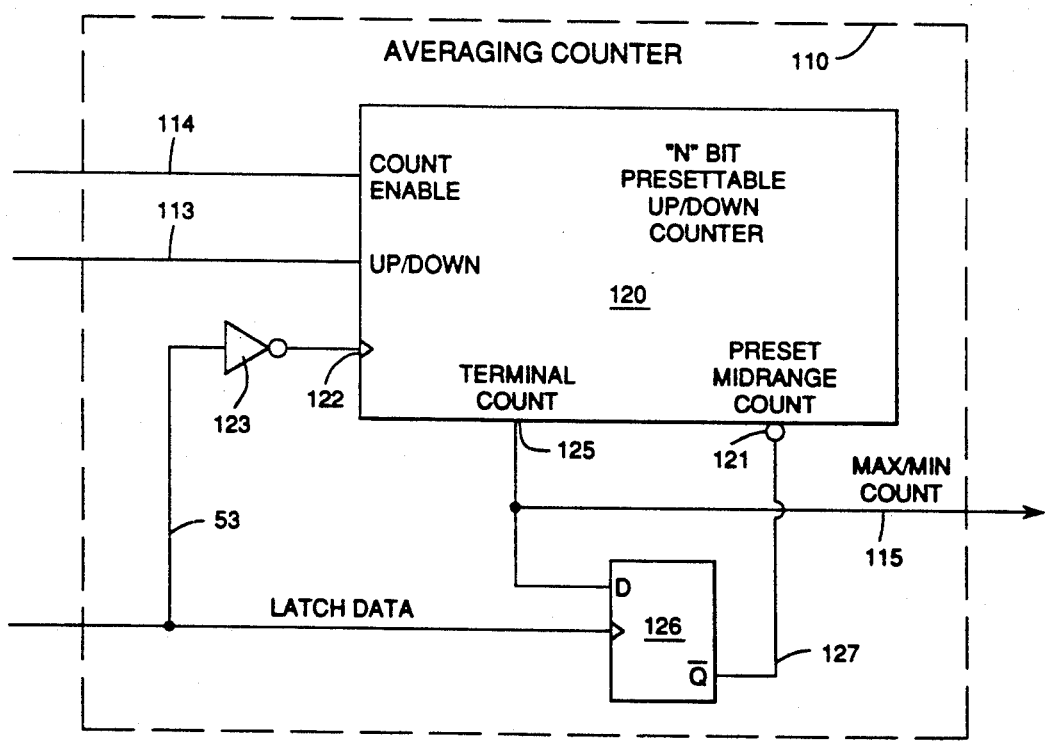
FIG. 6 is a block diagram of the averaging counter circuit which forms a part of the offset averaging circuit of FIG. 5.

Referring to FIG. 6, each averaging counter 110 is based on an "N" bit programmable up/down counter 120. The counter 120 is presettable to a midrange count, i.e. most significant bit "1" and all other bits "0", by activation of a PRESET MIDRANGE COUNT input 121. Each time the counter 120 reaches a maximum count of all bits "1" (overflow) or a minimum count of all bits "0" (underflow), the counter 120 is preset to the midrange count so that it will not overflow or underflow right away on succeeding cycles. The number of bits, "N", in the counter 120 determines the period over which the averaging of the offset error is performed. For example, if the counter 120 is three bits long, the midrange count is "4". Starting from the midrange count of "4", it will take three more increments than decrements, on the average, to reach a maximum count of "7", or four more decrements than increments to reach a minimum count of "0". As long as the number of increments and decrements are evenly divided, without long strings of one or the other, the count in counter 120 will fluctuate up and down between the "0" and "7" minimum and maximum counts, respectively. It should be apparent to those skilled in the art that a greater length for counter 120 (i.e. larger "N") would result in a longer averaging period, but slower offset adjustment, or "tracking", since at least N/2 samples would be required to overflow or underflow. Similarly, a smaller value of "N" would provide faster tracking, but may introduce "flutter", or false adjustment of the offset value due to an insufficiently long averaging period. A value for "N" of four bits has been found to be satisfactory, in addition to the value of three bits mentioned above, and the counter 120 may be provided with a means (not shown) for configuring "N" to select alternate values to suit different applications.

Still referring to FIG. 6, the detailed operation of the averaging counter 110 is as follows. The COUNT ENABLE and UP/DOWN signals 114 and 113, respectively, are connected directly to counter 120. The COUNT ENABLE signal 114 enables counter 120, while the UP/DOWN signal 113 determines the direction of counting. A clock input 122 for counter 120 is connected to the LATCH DATA signal 53 through inverter 123. Counter 120 therefore counts in response to the negative, or falling edge of the lATCH DATA signal 53, so that the UP/DOWN signal 113 has enough time to stabilize. Upon reaching either the minimum ("0") or maximum (all "1") count, the counter 120 activates a TERMINAL COUNT output 125. The TERMINAL COUNT output 125 is connected as a MAX/MIN COUNT output 115 for the averaging counter 110, and is also latched into flip-flop 126. The inverted output 127 from flip-flop 126 is connected to the PRESET MIDRANGE COUNT input 121 of counter 120. Therefore, when the counter 120 reaches the minimum or maximum count, the PRESET MIDRANGE COUNT input 121 is activated for one period of the LATCH DATA signal 53, forcing the counter 120 back to the midrange count. The fabrication of the counter 120 from known logic circuits to perform the above described function should be apparent to those skilled in the art, so that further description thereof should not be necessary.

It should be noted that the averaging counters 110a-110c hold their count values during periods when they are not enabled. When one averaging counter 110 is enabled during an autozero reference interval, that counter 110 starts from the last count that it held during the last autozero reference interval in which it was selected. In that way, the averaging process spans across periods of deactivation.

Referring to FIGS. 3 and 5, updating of the offset values in the offset registers 70 is performed using the adder 73 on a time multiplexed basis during the autozero reference interval. When the LATCH DATA signal 53 is high, the adder 73 is used to sum the A/D sample in latch 75 with the offset value for the currently enabled segment on bus 71. Then when the LATCH DATA signal 53 is low, one of the constant values 83-85 ("+1", "−1", or "0", respectively) is added to the offset value on bus 71, and the result on bus 56 is stored as a new offset value in the offset registers 70. The choice of which of the constant values 83-85 to use depends on the state of the above described averaging process, to either increment (add "+1"), decrement (add "1"), or leave unchanged (add "0") the current offset value.

Specifically, an addend "B" decode logic circuit 130 generates the enable signals 78 and 86-88 to command the addend "B" select multiplexer 77 to couple one of the input busses 76 or 83-85, respectively, through to adder 73 via an ADDEND "B" bus 81. The CALIBRATE MODE signal 105 is connected as one input to the addend "B" decode logic circuit 130. When the CALIBRATE MODE signal 105 is not active, the ENABLE A/D signal 78 is always active, and the other enable lines 86-88 are held deactivated. Recalling from the above description, the CALIBRATE MODE signal 105 is inactive during both normal data acquisitions and for the first three cycles of an autozero reference interval.

When the CALIBRATE MODE signal 105 becomes active, the enable lines 78 and 86-88 are multiplexed as follows. The LATCH DATA signal 53 is connected as another input to the addend "B" decode logic circuit 130. When the LATCH DATA signal 53 is active, i.e. "high", the ENABLE A/D signal 78 is made active to sum the A/D sample currently in latch 75 with the offset value on bus 71. Then when the LATCH DATA signal 53 goes "low", the ENABLE A/D signal 78 is deactivated and one of the enabling lines 86-88 for the constant values 83-85, respectively, is activated. The particular line 86-88 to be activated depends on the state of the above described averaging process, as indicated by UP/DOWN signal 113 and MAX/MIN COUNT output 115a-115c from the enabled averaging counter 110a-110c. The separate MAX/MIN COUNT outputs 115a-115c from each averaging counter 110a-110c, respectively, are "or'ed" together in OR gate 131. The MAX/MIN output 132 of OR gate 131, as well as UP/DOWN signal 113, are connected as inputs to the addend "B" decode logic circuit 130. If the MAX/MIN signal 132 is "false", then the enabled averaging counter 110a-110c has not overflowed or underflowed, and no change is to be made to the offset value. In that case, the ENABLE "0" line 88 is activated. Alternately, if the MAX/MIN signal 132 is "true", then the enabled averaging counter 110a-110c has either overflowed or underflowed, as indicated by the UP/DOWN signal 113. In that case, and further if the UP/DOWN signal 113 indicates counting was performed in the "up" direction (overflow), then the offset value needs to be decremented, and the ENABLE "−1" line 87 is activated. Similarly, if the UP/DOWN signal 113 indicates counting was performed in the "down" direction (underflow), then the offset value needs to be incremented, and the ENABLE "+1" line 86 is activated.

Figure 7:
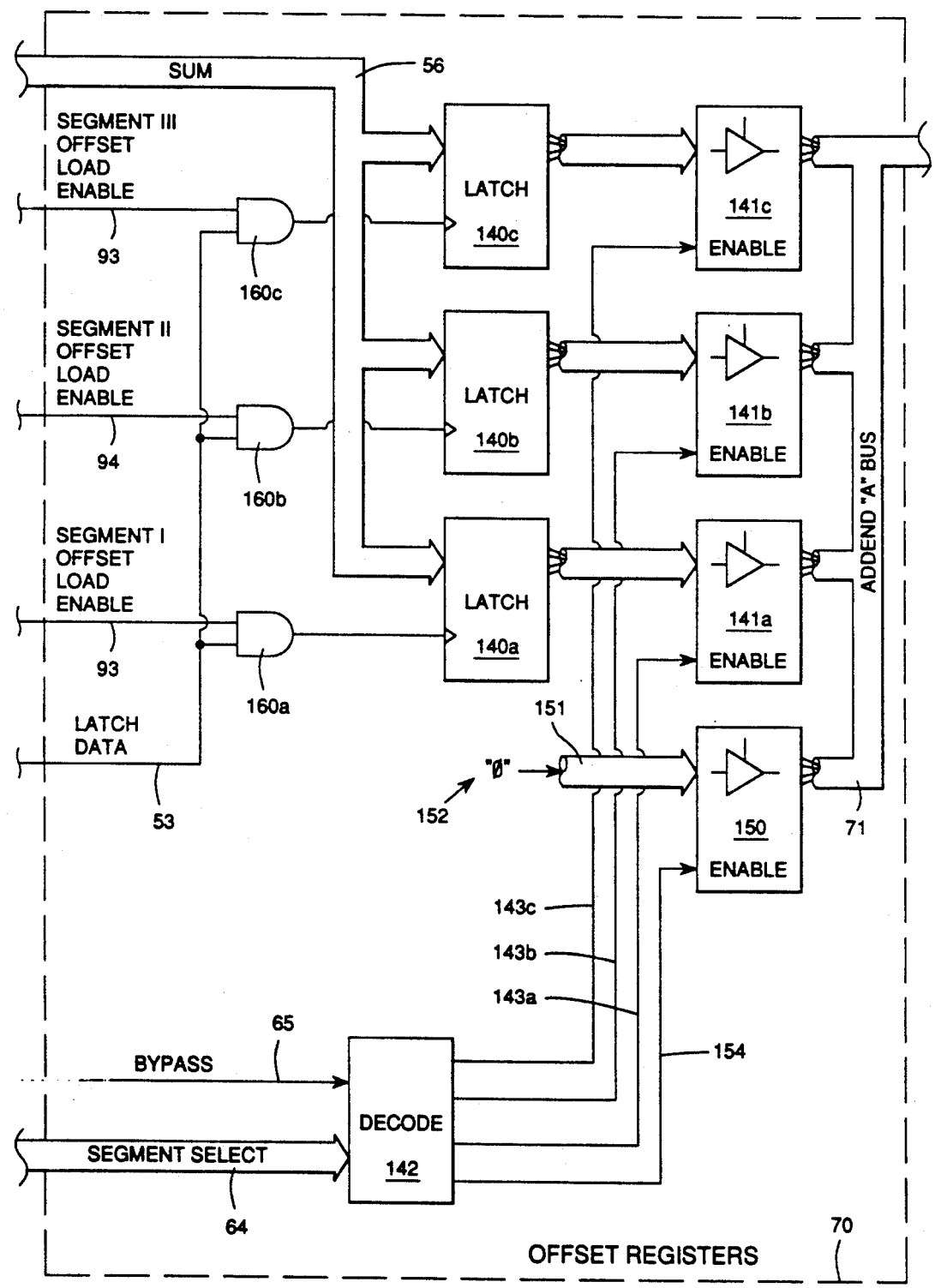
FIG. 7 is a block diagram of the offset registers block which forms a part of the digital autozeroing circuit of FIG. 3.

Referring now to FIGS. 3 and 7, the offset registers block 70 includes separate latches 140a-140c for storing the offset values corresponding to each of the segments I-III, respectively. The output of each latch 140a-140c is connected through a tri-state driver 141a-141c, respectively, onto the addend "A" bus 71. A decode circuit 142 generates enabling signals 143a-143c connected to a corresponding enable input on the tri-state drivers 141a-141c, respectively. For normal operation during both data acquisition and autozero reference intervals, the decode circuit 142 activates one of the enabling lines 143a-143c corresponding to the active segment as indicated by the SEGMENT SELECT bus 64. The offset value for the selected segment I-III is thereby coupled from the corresponding latch 140a-140c, through the enabled tri-state driver 141a-141c, respectively, onto the ADDEND "A" bus 71.

The offset registers block 70 also provides for suppression of the normal selection of one of the offset values in the latches 140a-140c. This capability is used when it is desired to pass raw, uncorrected A/D data through the digital autozero circuit 35, for example, as a diagnostic tool for measuring the net uncorrected system offsets. A fourth tri-state driver 150 has an input bus 151 connected to a binary representation for a constant value of zero 152. The output of tri-state driver 150 connects to the ADDEND "A" bus 71, and is enabled by a fourth enabling line 154 from the decode circuit 142. The decode circuit 142 receives the BYPASS signal 65 as an input, which when activated commands the decode circuit 142 to deactivate enabling lines 143a-143c and instead activate enabling line 154. Activation of the BYPASS signal 65 therefore results in placement of the zero value 152 on the ADDEND "A" bus 71, passing the A/D data through to output bus 56 unchanged. The decode circuit 142 is formed from logic gates to implement the above described functions, the detailed design of which should be apparent to those skilled in the art.

Still referring to FIGS. 3 and 7, the SUM bus 56 output from adder 73 is connected to an input of each latch 140a-140c in order to load the new offset values which have been computed as described above. A set of AND gates 160a-160c are used to gate the LATCH DATA signal 53 with one of the SEGMENT OFFSET LOAD ENABLE lines 93-95, respectively. The output of each AND gate 160a-160c is connected to a clock input on the corresponding latch 140a-140c, respectively. Therefore, only the offset value for the currently selected segment is updated, and the new offset value for that selected segment is loaded in response to each rising edge of the LATCH DATA signal 53. Note that all of the SEGMENT OFFSET LOAD ENABLE lines 93-95 are disabled by the segment counter 90 during the data acquisition interval, so that no updating of the offset values in latches 140a-140c occurs while data acquisition is in progress. Therefore the latches 140a-140c hold their last computed offset values during the data acquisition interval, which are then used in the offset correction computations for all three segments I-III.

Figure 8:
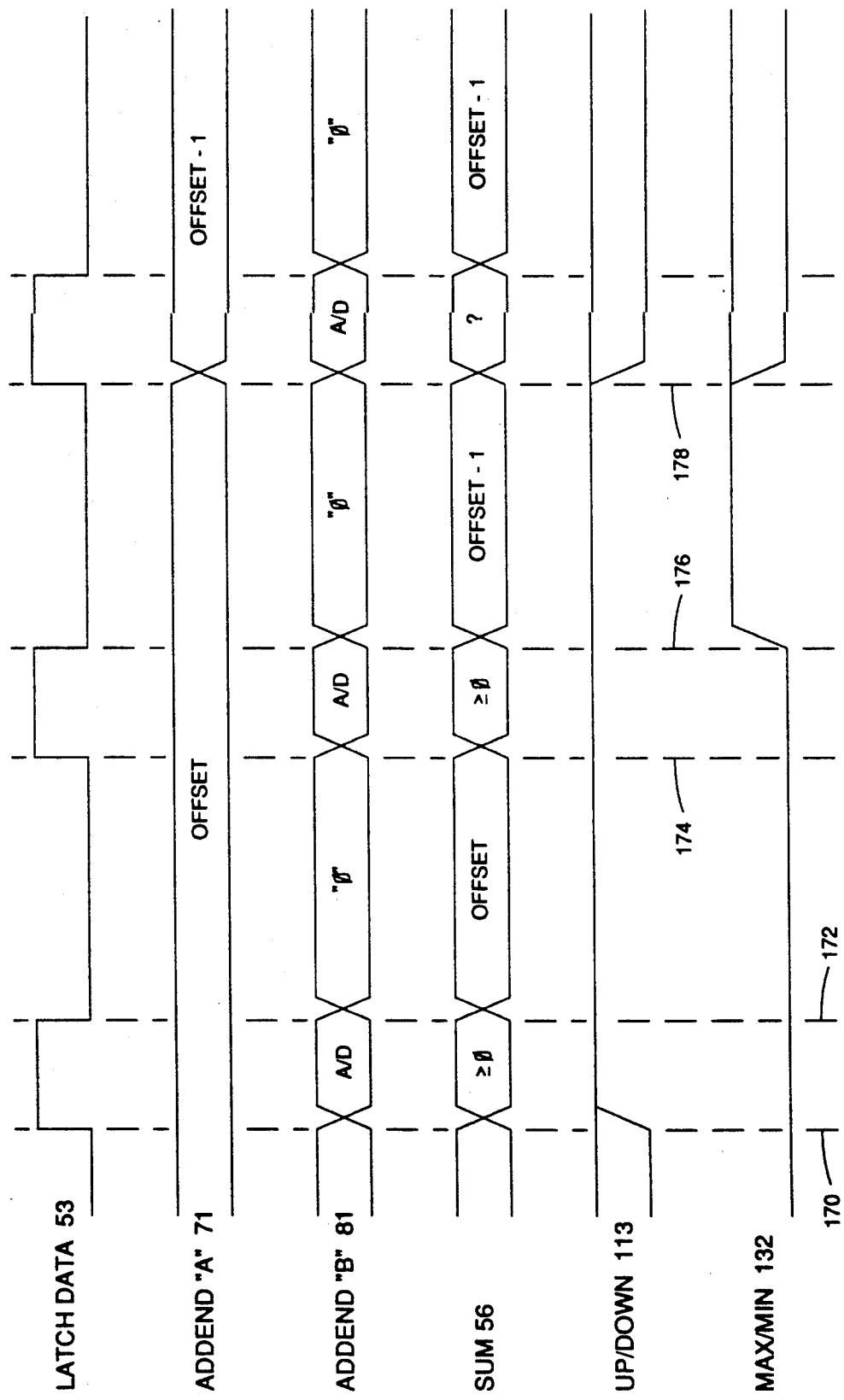
FIG. 8 is a timing diagram for the digital autozeroing apparatus of FIGS. 3-5.

Referring to FIG. 8, the timing for the signals used in updating the offset values is now described in relation to an example of a typical updating sequence. In the following example, it is assumed that an autozero reference interval is in progress (i.e. the CALIBRATE MODE signal 105 is active) and one of the segments I-III is enabled for updating by activation of the appropriate SEGMENT OFFSET LOAD ENABLE line 93-95. Dotted line 170 indicates a time corresponding to a first rising edge of the LATCH DATA signal 53. At time 170, the current offset value for the enabled segment is present on the ADDEND "A" bus 71, and the current A/D sample is latched into input latch 75 and propagated through to ADDEND "B" bus 81. Shortly thereafter, the SUM output bus 56 from adder 73 reflects the summation of the addend A and B busses 71 and 81, respectively. In this example it is assumed that the A/D sample latched at time 170 results in a nonnegative value, so that the UP/DOWN signal 113 on the output of transparent latch 113 indicates "up". On the negative edge 172 of the LATCH DATA signal 53, the appropriate counter 120 is clocked, and counts "up" as commanded by the UP/DOWN signal 113. At time 172, however, it is assumed for this example the the active counter 120 has not yet overflowed, so that the MAX/MIN signal 132 remains deactivated, and the "0" value is selected for ADDEND "B" bus 81.

Then at time 174, the new offset value on bus 56, unchanged due to the "0" on the ADDEND "B" bus, is clocked into the appropriate latch 140 by a second rising edge of the LATCH DATA signal 53. Having stored the new offset value, the above cycle is repeated with a new A/D sample, except in this case it is assumed that another count "up" condition exists, and results in overflow of the selected counter 120. In that event, the MAX/MIN signal 132 becomes "true" at time 176, and the "−1" value is placed on the ADDEND "B" bus 81. On the subsequent rising edge 178 of the LATCH DATA signal 53, the decremented offset value (i.e. "offset −1") is latched into the appropriate latch 140 as the new offset value. The new offset value is now one count lower than the previous value, and will be closer to producing an equal number of "up" versus "down" results, on the average.

The above described circuitry is preferably implemented on a singe, large scale application specific integrated circuit (ASIC). It should be apparent to those skilled in the art that there is a wide range of logic circuit implementations equivalent to those in the above described preferred embodiment, with any and all such implementations being contemplated by this invention. For example, the latches 140a–140c could instead comprise up/down counters which are updated by gating them to count up, count down, or not count, instead of loading an additively altered value in parallel.

We claim:

1. A digital autozeroing apparatus for correcting an offset error in a data acquisition system of a type including an analog input and an analog to digital (A/D) converter for producing a digital output, the digital autozeroing apparatus comprising;
   a digital storage device for storing an offset value;
   a digital adder having a first input connected to receive the offset value from the digital storage device and a second input connected to receive the digital output of the A/D converter, the digital adder producing a corrected digital output value by adding the offset value to the A/D converter digital output; and
   a control circuit for updating the offset value in the digital storage device by (a) applying a predetermined reference voltage to the analog input of the data acquisition system, (b) comparing the corrected digital output value with a predetermined reference value, and (c) if the corrected digital output value is different than the predetermined reference value, then changing the offset value in the digital storage device so as to reduce a difference between the corrected digital output value and the predetermined reference value.

2. The digital autozeroing apparatus as recited in claim 1 in which the data acquisition system includes a floating point amplifier connected between the analog input and the A/D converter, the floating point amplifier providing amplification of the analog input in one active gain range segment out of a plurality of available discrete gain range segments, and in which (i) the digital autozeroing apparatus includes a separate digital storage device for each available discrete gain range segment of the floating point amplifier, (ii) each digital storage device stores an offset value corresponding to one of the available discrete gain range segments, (iii) the first input of the digital adder is selectably connected to receive the offset value corresponding to the active gain range segment, and (iv) the control circuit updates the offset value corresponding to the active gain range segment.

3. The digital autozeroing apparatus as recited in claim 1 in which the comparison recited in part (b) comprises acquiring a plurality of individual comparisons, with each individual comparison yielding a result which includes a numeric sign of the difference between the corrected digital output value and the predetermined reference value, and with a first number of individual comparisons yielding results having a first value of numeric sign and a second number of individual comparisons yielding results having a second value of numeric sign, and in which the changing of the offset value in part (c) is performed only when the first number of individual comparisons exceeds the second number of individual comparisons by a predetermined number.

4. A method for correcting an offset error in a data acquisition system of a type including an analog input and an analog to digital (A/D) converter for producing a digital output, the method comprising the steps of;
   (a) storing an offset value in a digital storage device;
   (b) adding the offset value from the digital storage device to the digital output of the A/D converter to produce a corrected digital output value; and
   (c) updating the offset value in the digital storage device by performing the steps of;
   (d) applying a predetermined reference voltage to the analog input of the data acquisition system;
   (e) comparing the corrected digital output value with a predetermined reference value; and
   (f) if the corrected digital output value is different than the predetermined reference value, then changing the offset value in the digital storage device so as to reduce a difference between the corrected digital output value and the predetermined reference value.

5. The method recited in claim 4 in which the data acquisition system includes a floating point amplifier connected between the analog input and the A/D converter, the floating point amplifier providing amplification of the analog input in one active gain range segment out of a plurality of available discrete gain range segments, and in which step (a) comprises storing an offset value in each one of a plurality of separate digital storage devices, each digital storage device being associated with one of the available discrete gain range segments of the floating point amplifier, and in which the digital storage device used in steps (b) and (f) is the digital storage device corresponding to the active gain range segment.

6. The method recited in claim 4 in which the comparison in step (e) comprises acquiring a plurality of individual comparisons, with each individual comparison yielding a result which includes a numeric sign of the difference between the corrected digital output value and the predetermined reference value, and with a first number of individual comparisons yielding results having a first value of numeric sign and a second number of individual comparisons yielding results having a second value of numeric sign, and in which the changing of the offset value in step (f) is performed only when the first number of individual comparisons exceeds the second number of individual comparisons by a predetermined number.

* * * * *